(12) United States Patent
Choi et al.

(10) Patent No.: US 10,872,645 B1
(45) Date of Patent: Dec. 22, 2020

(54) SEMICONDUCTOR DEVICES

(71) Applicant: SK hynix Inc., Icheon-si Gyeonggi-do (KR)

(72) Inventors: Geun Ho Choi, Icheon-si Gyeonggi-do (KR); Kyung Mook Kim, Icheon-si Gyeonggi-do (KR); Woongrae Kim, Icheon-si Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/731,848

(22) Filed: Dec. 31, 2019

(30) Foreign Application Priority Data

Sep. 6, 2019 (KR) .................. 10-2019-0111076

(51) Int. Cl.
| | | |
|---|---|---|
| *G11C 29/00* | (2006.01) | |
| *G11C 7/22* | (2006.01) | |
| *G11C 7/10* | (2006.01) | |
| *G11C 8/06* | (2006.01) | |
| *G11C 29/18* | (2006.01) | |
| *G11C 29/12* | (2006.01) | |
| *G11C 29/14* | (2006.01) | |
| *G11C 8/10* | (2006.01) | |

(52) U.S. Cl.
CPC .............. *G11C 7/22* (2013.01); *G11C 7/1051* (2013.01); *G11C 8/06* (2013.01); *G11C 8/10* (2013.01); *G11C 29/12015* (2013.01); *G11C 29/14* (2013.01); *G11C 29/18* (2013.01)

(58) Field of Classification Search
CPC ............ G11C 7/22; G11C 7/1051; G11C 8/10; G11C 29/12015; G11C 29/14; G11C 29/18
USPC ......................................... 365/201
See application file for complete search history.

(56) References Cited

U.S. PATENT DOCUMENTS

| | | | | |
|---|---|---|---|---|
| 2008/0111596 A1* | 5/2008 | Lee | .................. | H03L 7/0814 327/153 |
| 2014/0055183 A1* | 2/2014 | Jung | .................. | H03L 7/0816 327/158 |
| 2018/0349302 A1 | 12/2018 | Mirichigni et al. | | |

FOREIGN PATENT DOCUMENTS

KR 1020180080581 A 7/2018

* cited by examiner

*Primary Examiner* — Huan Hoang
(74) *Attorney, Agent, or Firm* — William Park & Associates Ltd.

(57) ABSTRACT

A semiconductor device includes a variable delay circuit and an address latch circuit. The variable delay circuit delays a read signal by a delay time to generate a latch control signal during an initialization operation and receives a feedback signal to adjust the delay time for delaying the read signal during the initialization operation. The address latch circuit detects a logic level of a transfer address when the latch control signal is inputted to the address latch circuit and generates the feedback signal.

24 Claims, 15 Drawing Sheets

FIG. 4

| CS | CA<1> | CA<2> | CA<3> | CA<4> | CA<5> |
|---|---|---|---|---|---|
| L | H | L | H | H | H |

READ

SEMICONDUCTOR DEVICES

CROSS-REFERENCE TO RELATED APPLICATIONS

The present application claims priority under 35 U.S.C § 119(a) to Korean Application No. 10-2019-0111076, filed on Sep. 6, 2019, which is incorporated herein by reference in its entirety.

BACKGROUND

1. Technical Field

Embodiments of the present disclosure relate to semiconductor devices training a moment for latching an address.

2. Related Art

In the case of semiconductor devices such as dynamic random access memory (DRAM) devices, a read operation and a write operation need to be performed precisely. In order to perform the read operation and the write operation precisely, it may be important to match an address having information on a location in which data are stored to a latch signal for latching the address.

However, as semiconductor devices become more highly integrated using advanced fabrication techniques, the number of memory cells integrated into semiconductor devices has continuously increased. In such a case, internal circuits of the semiconductor device may have various signal paths, and the semiconductor devices may malfunction due to mismatch between signals transmitted through the various signal paths when an external environment changes.

SUMMARY

According to an embodiment, a semiconductor device includes a variable delay circuit and an address latch circuit. The variable delay circuit is configured to delay a read signal by a delay time to generate a latch control signal during an initialization operation and is configured to receive a feedback signal to adjust the delay time for delaying the read signal during the initialization operation. The address latch circuit is configured to detect a logic level of a transfer address when the latch control signal is inputted to the address latch circuit and to generate the feedback signal.

According to another embodiment, a semiconductor device includes a training control circuit, a variable delay circuit, and an address latch circuit. The training control circuit is configured to generate a read signal from a first internal read signal and a second internal read signal and is configured to generate a transfer address from the test mode signal and the first and second internal read signals during an initialization operation. The variable delay circuit is configured to delay the read signal to generate a latch control signal and is configured to receive a feedback signal to adjust a delay time for delaying the read signal. The address latch circuit is configured to detect a logic level of the transfer address when the latch control signal is inputted to the address latch circuit and configured to generate the feedback signal.

BRIEF DESCRIPTION OF THE DRAWINGS

FIG. 4 is a table illustrating an operation of the command decoder shown in FIG. 3.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
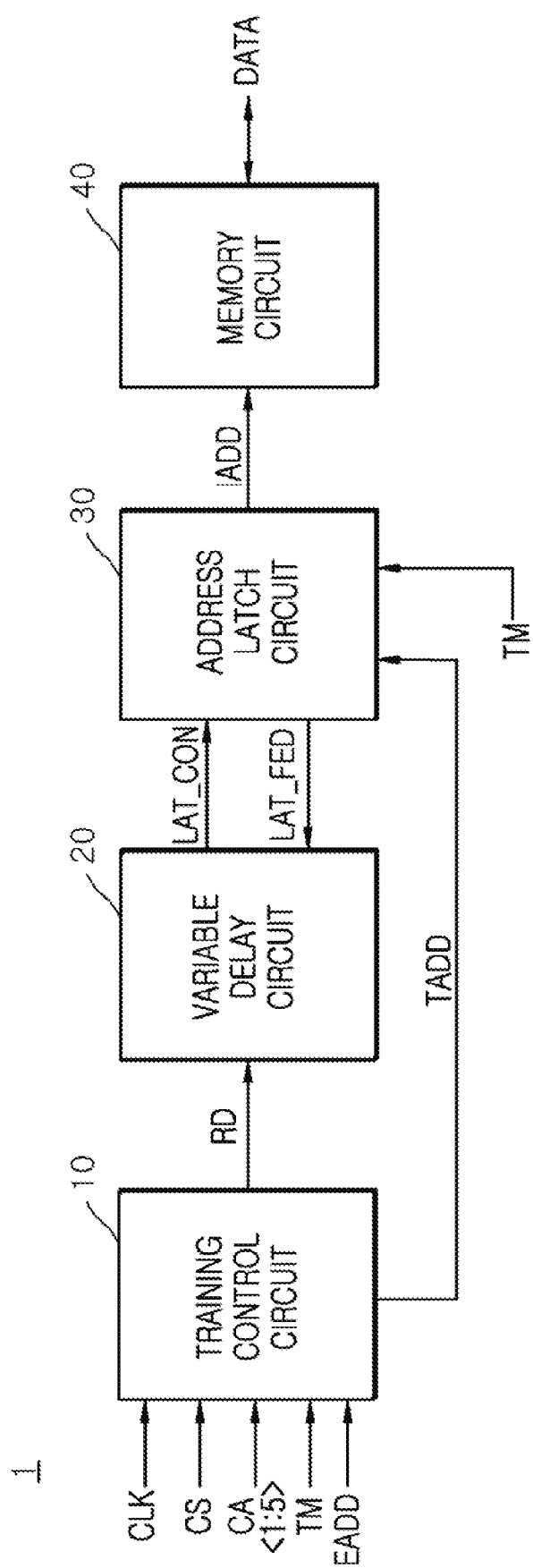
FIG. 1 is a block diagram illustrating a configuration of a semiconductor device according to an embodiment of the present disclosure.

As illustrated in FIG. 1, a semiconductor device 1 according to an embodiment may include a training control circuit 10, a variable delay circuit 20, an address latch circuit 30, and a memory circuit 40.

The training control circuit 10 may be synchronized with a clock signal CLK to generate a read signal RD according to a test mode signal TM during an initialization operation. The training control circuit 10 may generate a transfer address TADD according to the test mode signal TM during the initialization operation. The training control circuit 10 may generate the read signal RD according to a logic level combination of a chip selection signal CS and first to fifth command/address signals CA<1:5> in a normal mode. The training control circuit 10 may generate the transfer address TADD from an external address EADD in the normal mode. The initialization operation may be set as an operation for controlling phases of internal clock signals generated by a delay locked loop (DLL) circuit before the normal mode is activated. The normal mode may be set as an operation mode in which a read operation and a write operation of the semiconductor device 1 are performed. The test mode signal TM may be set as a signal which is enabled to activate the initialization operation of the semiconductor device 1. The external address EADD may be set as a signal for selecting at least one memory cell (not shown) included in the memory circuit 40. A logic level combination of the chip selection signal CS and the first to fifth command/address signals CA<1:5> for generating the read signal RD in the normal mode is described in detail with reference to FIGS. 3 and 4 later.

The variable delay circuit 20 may delay the read signal RD to generate a latch control signal LAT_CON during the initialization operation. The variable delay circuit 20 may receive a feedback signal LAT_FED to adjust a delay time for delaying the read signal RD during the initialization operation. The variable delay circuit 20 may gradually increase the delay time for delaying the read signal RD during the initialization operation. The variable delay circuit 20 may delay the read signal by the controlled delay time to generate the latch control signal LAT_CON in the normal mode.

The address latch circuit 30 may detect a logic level of the transfer address TADD when the latch control signal LAT_CON is inputted during the initialization operation, thereby generating the feedback signal LAT_FED. The address latch circuit 30 may generate the feedback signal LAT_FED which is enabled when the transfer address TADD has a predetermined logic level when the latch control signal LAT_CON is inputted during the initialization operation. The address latch circuit 30 may compare the latch control signal LAT_CON with the transfer address TADD based on the test mode signal to generate the feedback signal LAT_FED. The address latch circuit 30 may generate an internal address IADD from the transfer address TADD when the latch control signal LAT_CON is inputted in the normal mode.

The word "predetermined" as used herein with respect to a logic level or a logic level combination means that a value or values for the logic level or the logic level combination are determined prior to the logic level or the logic level combination being used in a process or algorithm. For some embodiments, the value or values is or are determined before the process or algorithm begins. In other embodiments, the value or values is or are determined during the process or algorithm but before the value or values is or are used in the process or algorithm.

The memory circuit 40 may output data DATA stored in memory cells (not shown) which are selected by the internal address IADD. The memory circuit 40 may store the data DATA, which are provided by an external device or an external system, into the memory cells (not shown) which are selected by the internal address IADD.

Figure 2:
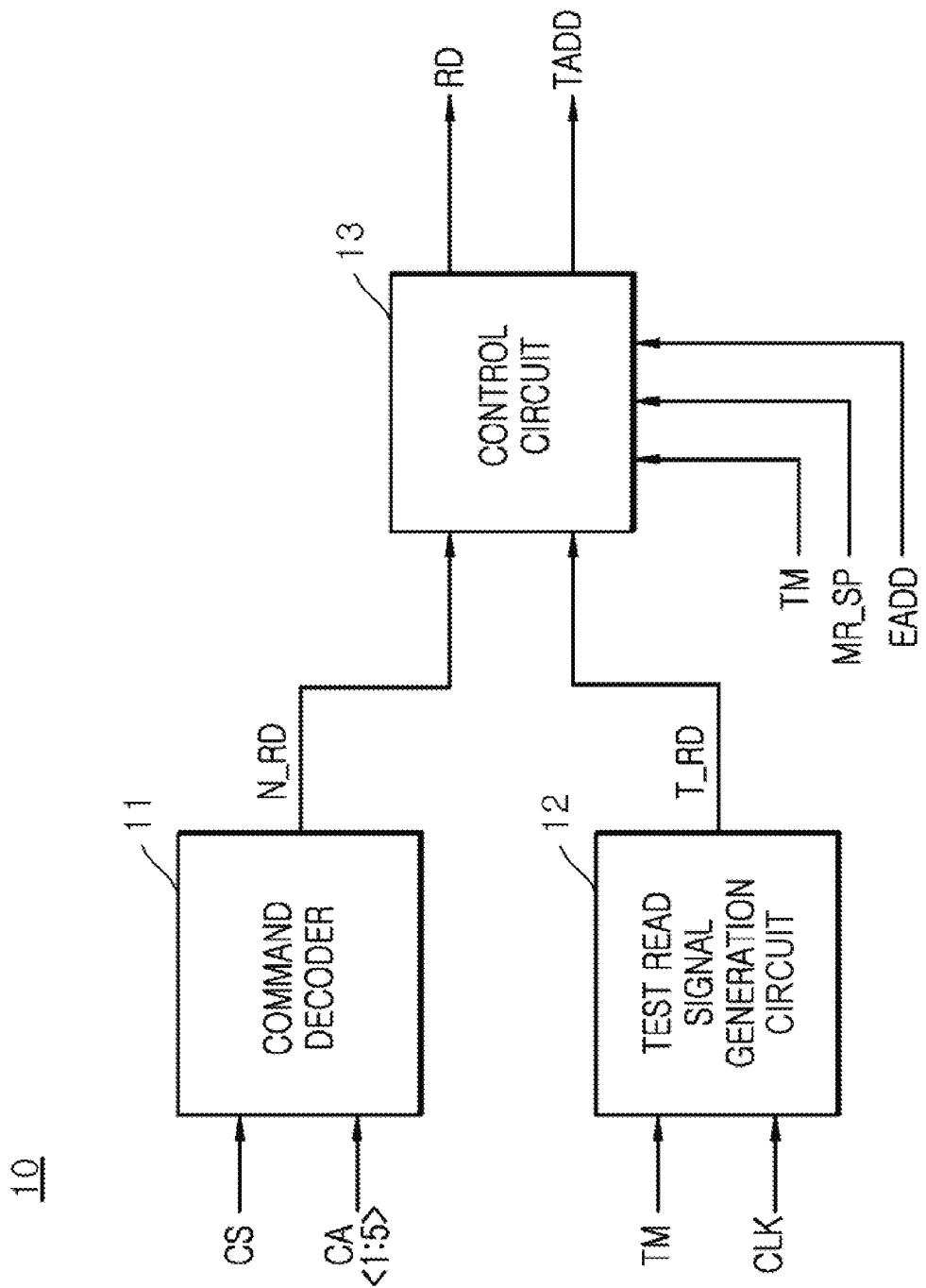
FIG. 2 is a block diagram illustrating a configuration of a training control circuit included in the semiconductor device of FIG. 1.

Referring to FIG. 2, the training control circuit 10 may include a command decoder 11, a test read signal generation circuit 12, and a control circuit 13.

The command decoder 11 may generate a normal read signal N_RD according to a logic level combination of the chip selection signal CS and the first to fifth command/address signals CA<1:5>. The command decoder 11 may generate the normal read signal N_RD which is enabled when the chip selection signal CS and the first to fifth command/address signals CA<1:5> have a predetermined logic level combination. The logic level combination of the chip selection signal CS and the first to fifth command/address signals CA<1:5> for generating the normal read signal N_RD is described in detail with reference to FIGS. 3 and 4 later.

The test read signal generation circuit 12 may generate a test read signal T_RD which is enabled by the clock signal CLK during the initialization operation. The test read signal generation circuit 12 may generate the test read signal T_RD which is initialized by the test mode signal TM. The test read signal generation circuit 12 may generate the test read signal T_RD which is enabled by the clock signal CLK.

The control circuit 13 may generate the read signal RD from the normal read signal N_RD and the test read signal T_RD based on the test mode signal TM and an operation frequency set signal MR_SP. The control circuit 13 may generate the read signal RD from the test read signal T_RD based on the operation frequency set signal MR_SP during the initialization operation. The control circuit 13 may generate the read signal RD from the normal read signal N_RD based on the operation frequency set signal MR_SP in the normal mode. The control circuit 13 may generate the transfer address TADD from the test mode signal TM during the initialization operation. The control circuit 13 may generate the transfer address TADD from the external address EADD in the normal mode. The operation frequency set signal MR_SP may be set as a signal including information on an operation speed of the semiconductor device 1. The operation frequency set signal MR_SP may be set as a signal which is enabled when the semiconductor device 1 performs a fast operation.

Figure 3:
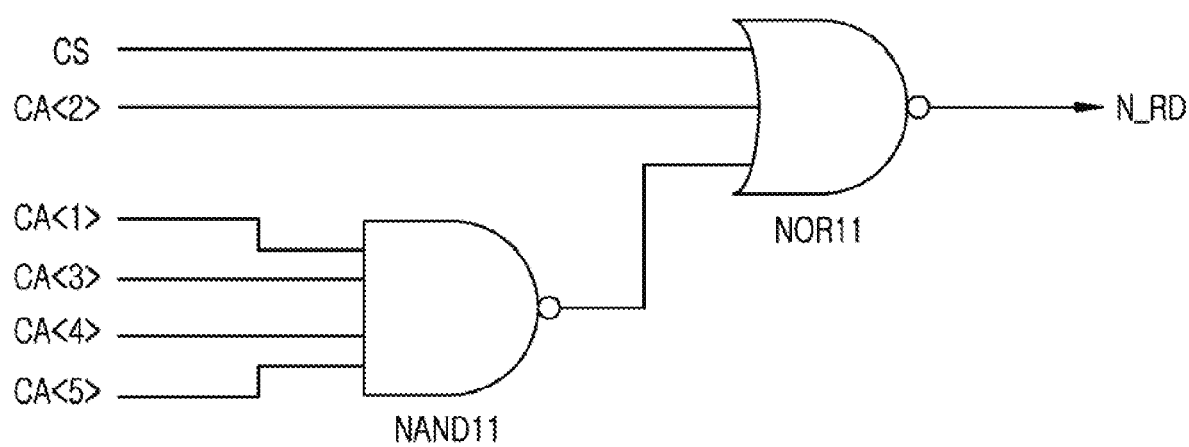
FIG. 3 is a circuit diagram illustrating a configuration of a command decoder included in the training control circuit of FIG. 2.

Referring to FIG. 3, the command decoder 11 may include a NAND gate NAND11 and a NOR gate NOR11.

The command decoder 11 may generate the normal read signal N_RD for performing a read operation (READ of FIG. 4) in the normal mode. The command decoder 11 may generate the normal read signal N_RD which is enabled when a logic level combination of the chip selection signal CS and the first to fifth command/address signals CA<1:5> has a predetermined logic level combination.

The predetermined logic level combination of the chip selection signal CS and the first to fifth command/address signals CA<1:5> is described hereinafter with reference to FIG. 4.

Figure 4:
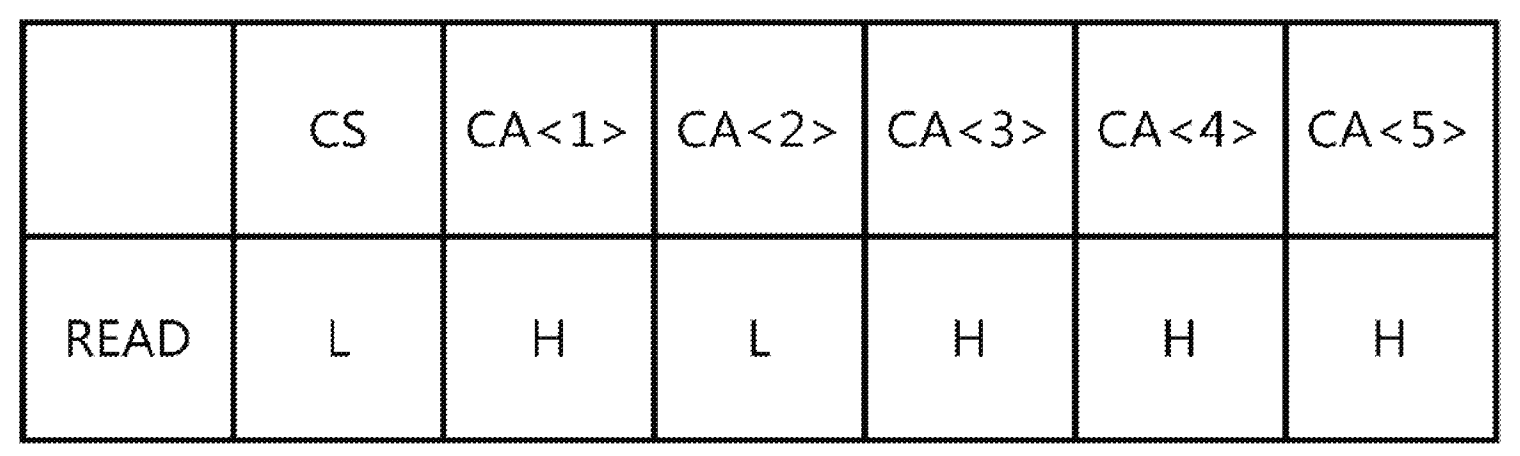

Referring to FIG. 4, the command decoder 11 may generate the normal read signal N_RD which is enabled to have a logic "high(H)" level when the first command/address signal CA<1> has a logic "high(H)" level, the second command/address signal CA<2> has a logic "low (L)" level, and the third to fifth command/address signals CA<3:5> have a logic "high(H)" level while the chip selection signal CS has a logic "low(L)" level. The logic level combination of the chip selection signal CS and the first to fifth command/address signals CA<1:5> for generating the normal read signal N_RD may be set to be different according to the embodiments.

Figure 5:
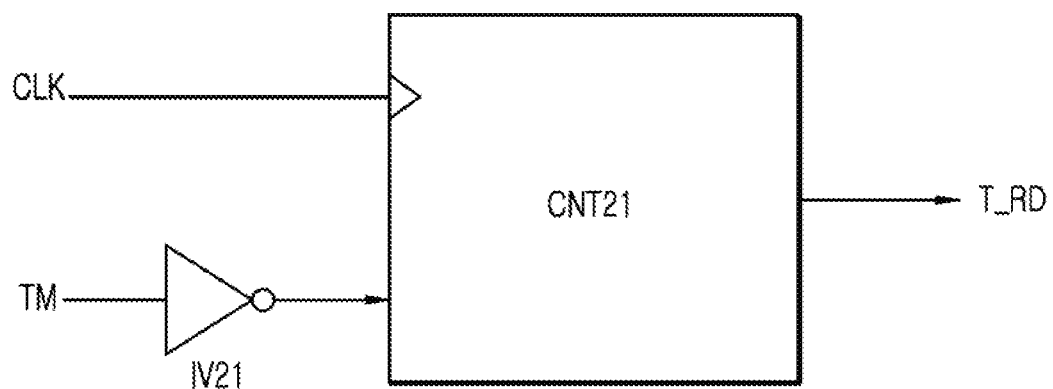
FIG. 5 illustrates a configuration of a test read signal generation circuit included in the training control circuit of FIG. 2.

Referring to FIG. 5, the test read signal generation circuit 12 may be realized using an inverter IV21 and a counter CNT21.

The test read signal generation circuit 12 may generate the test read signal T_RD which is initialized to have a logic "low" level by the test mode signal TM having a logic "high" level when the initialization operation is activated. The test read signal generation circuit 12 may generate the test read signal T_RD which is enabled to have a logic "high" level by the clock signal CLK after the initialization operation is activated.

Figure 6:
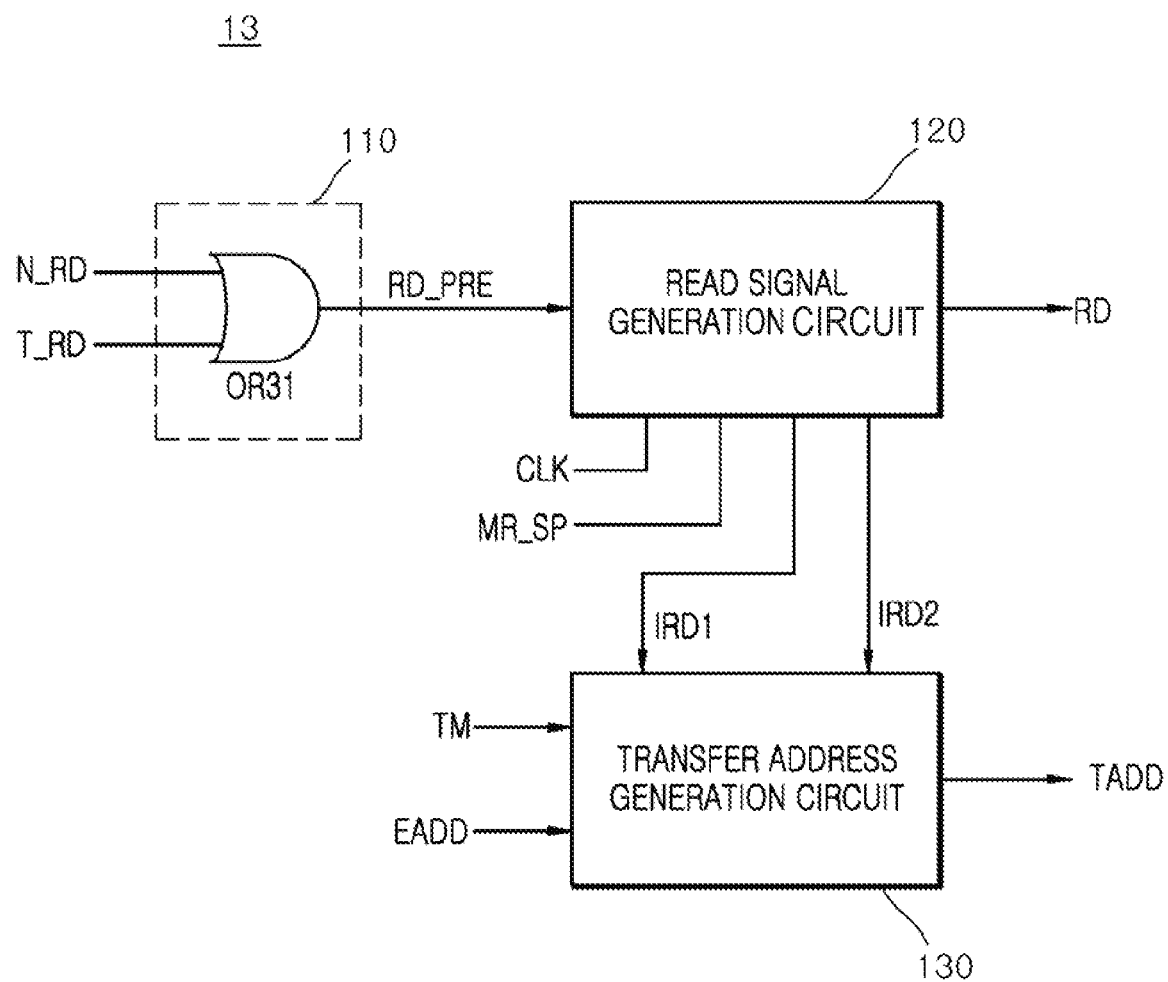
FIG. 6 illustrates a configuration of a control circuit included in the training control circuit of FIG. 2.

Referring to FIG. 6, the control circuit 13 may include a pre-read signal generation circuit 110, a read signal generation circuit 120, and a transfer address generation circuit 130.

The pre-read signal generation circuit 110 may be realized using an OR gate OR31. The pre-read signal generation circuit 110 may generate a pre-read signal RD_PRE which is enabled to have a logic "high" level when any one or both of the normal read signal N_RD and the test read signal T_RD has a logic "high" level. The pre-read signal generation circuit 110 may perform a logical OR operation of the normal read signal N_RD and the test read signal T_RD to generate the pre-read signal RD_PRE.

The read signal generation circuit 120 may repeatedly delay the pre-read signal RD_PRE in synchronization with the clock signal CLK to sequentially generate a first internal read signal IRD1 and a second internal read signal IRD2. The read signal generation circuit 120 may be synchronized with the clock signal CLK to output one of the first internal read signal IRD1 and the second internal read signal IRD2 as the read signal RD based on the operation frequency set signal MR_SP.

The transfer address generation circuit 130 may generate the transfer address TADD from the test mode signal TM and the first and second internal read signals IRD1 and IRD2 during the initialization operation. The transfer address generation circuit 130 may generate the transfer address TADD from the external address EADD in the normal mode.

Figure 7:
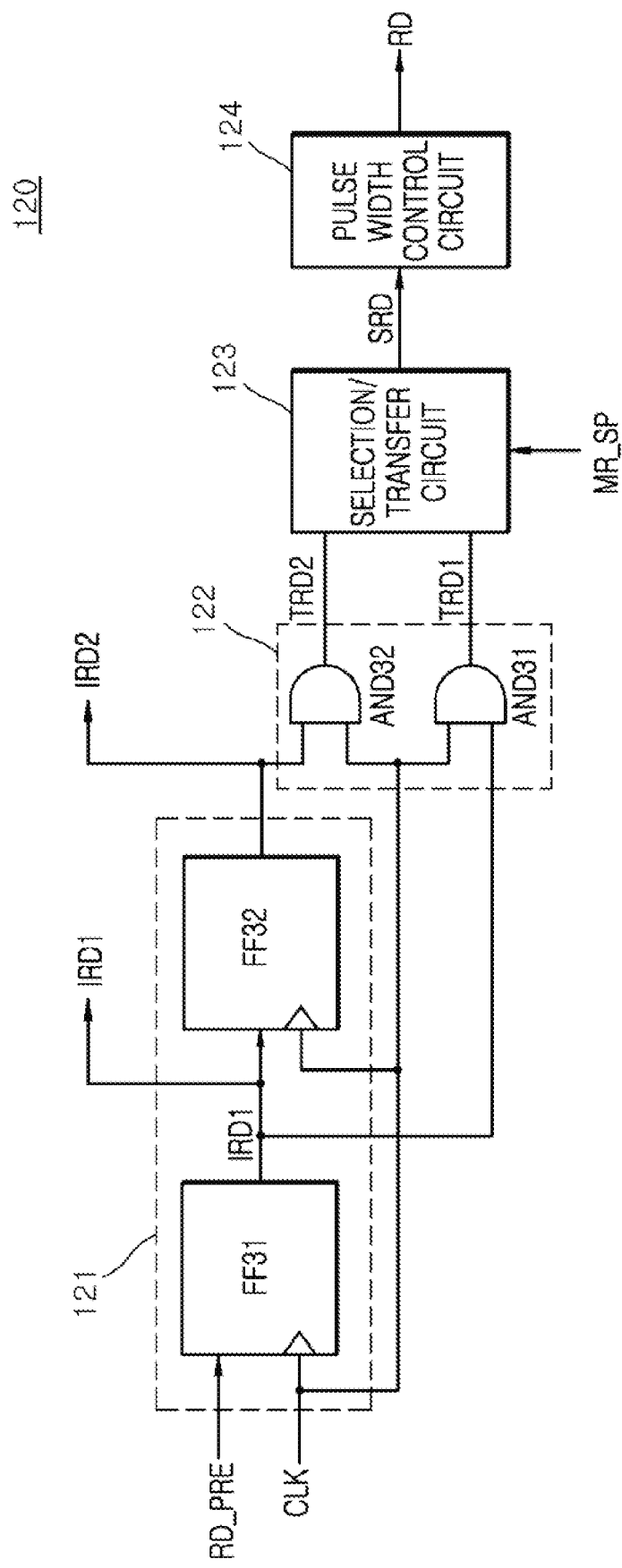
FIG. 7 illustrates a configuration of a read signal generation circuit included in the control circuit of FIG. 6.

Referring to FIG. 7, the read signal generation circuit 120 may include an internal read signal generation circuit 121, a transfer read signal generation circuit 122, a selection/transfer circuit 123, and a pulse width control circuit 124.

The internal read signal generation circuit 121 may be realized using flip-flops FF31 and FF32. The flip-flop FF31 may delay the pre-read signal RD_PRE in synchronization with the clock signal CLK to generate the first internal read signal IRD1. The flip-flop FF31 may delay the pre-read signal RD_PRE by one cycle of the clock signal CLK to generate the first internal read signal IRD1. The flip-flop FF32 may delay the first internal read signal IRD1 in synchronization with the clock signal CLK to generate the second internal read signal IRD2. The flip-flop FF32 may delay the first internal read signal IRD1 by one cycle of the clock signal CLK to generate the second internal read signal IRD2. The one cycle of the clock signal CLK may be set as a time interval during which the clock signal CLK is toggled twice.

The transfer read signal generation circuit 122 may be realized using AND gates AND31 and AND32. The AND gate AND31 may buffer the first internal read signal IRD1 in synchronization with the clock signal CLK to generate a first transfer read signal TRD1. The AND gate AND31 may buffer the first internal read signal IRD1 to generate the first transfer read signal TRD1 during a period that the clock signal CLK is generated to have a logic "high" level. The AND gate AND32 may buffer the second internal read signal IRD2 in synchronization with the clock signal CLK to generate a second transfer read signal TRD2. The AND gate AND32 may buffer the second internal read signal IRD2 to generate the second transfer read signal TRD2 during a period that the clock signal CLK is generated to have a logic "high" level.

The selection/transfer circuit 123 may output one of the first transfer read signal TRD1 and the second transfer read signal TRD2 as a selection read signal SRD based on the operation frequency set signal MR_SP. The selection/transfer circuit 123 may output the first transfer read signal TRD1 as the selection read signal SRD when the operation frequency set signal MR_SP is enabled. The selection/transfer circuit 123 may output the second transfer read signal TRD2 as the selection read signal SRD when the operation frequency set signal MR_SP is disabled. A case for which the operation frequency set signal MR_SP is enabled may correspond to a case for which the semiconductor device 1 performs a fast operation.

The pulse width control circuit 124 may generate the read signal RD including a pulse which is created when the selection read signal SRD is inputted to the pulse width control circuit 124. The pulse width control circuit 124 may control a pulse width of the selection read signal SRD to generate the read signal RD.

Figure 8:
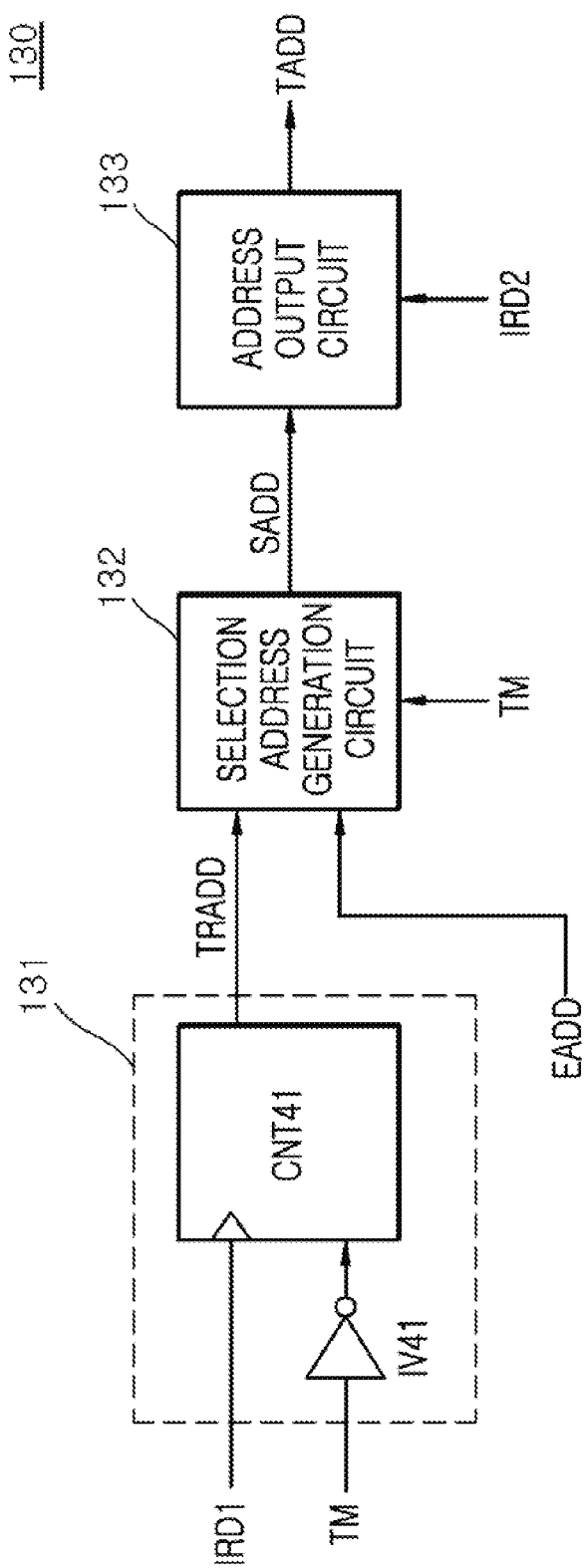
FIG. 8 illustrates a configuration of a transfer address generation circuit included in the control circuit of FIG. 6.

Referring to FIG. 8, the transfer address generation circuit 130 may include a transfer read address generation circuit 131, a selection address generation circuit 132, and an address output circuit 133.

The transfer read address generation circuit 131 may be realized using an inverter IV41 and a counter CNT41. The transfer read address generation circuit 131 may generate a transfer read address TRADD which is initialized to have a logic "low" level by the test mode signal TM having a logic "high" level when the initialization operation is activated. The transfer read address generation circuit 131 may generate the transfer read address TRADD which is enabled to have a logic "high" level by the first internal read signal IRD1 after the initialization operation is activated.

The selection address generation circuit 132 may generate a selection address SADD from the transfer read address TRADD and the external address EADD based on the test mode signal TM. The selection address generation circuit 132 may generate the selection address SADD from the transfer read address TRADD based on the test mode signal TM which is enabled to have a logic "high" level during the initialization operation. The selection address generation circuit 132 may generate the selection address SADD from the external address EADD based on the test mode signal TM which is disabled to have a logic "low" level in the normal mode.

The address output circuit 133 may output the selection address SADD as the transfer address TADD based on the second internal read signal IRD2. The address output circuit 133 may output the selection address SADD as the transfer address TADD when the second internal read signal IRD2 is inputted to the address output circuit 133.

Figure 9:
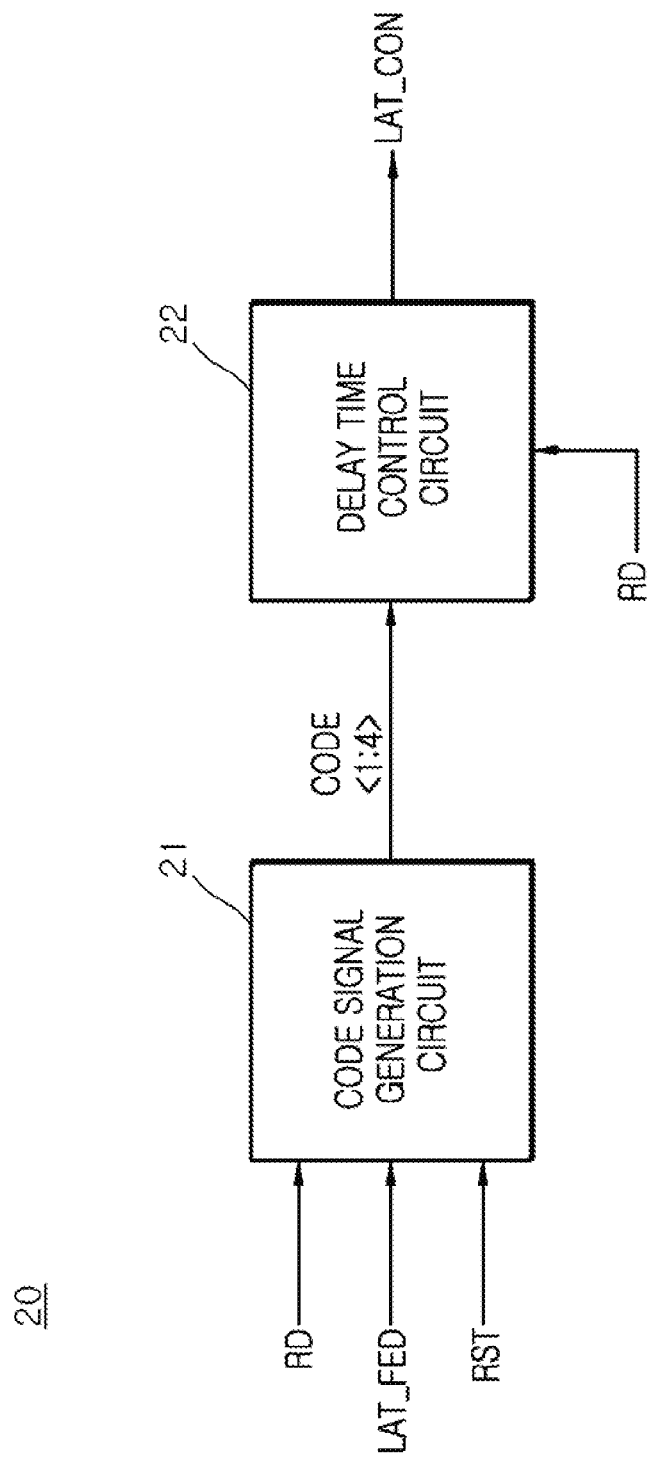
FIG. 9 is a block diagram illustrating a configuration of a variable delay circuit included in the semiconductor device of FIG. 1.

Referring to FIG. 9, the variable delay circuit 20 may include a code signal generation circuit 21 and a delay time control circuit 22.

The code signal generation circuit 21 may generate first, second, third, and fourth (also referred to as first to fourth) code signals CODE<1:4> which are initialized by a reset signal RST. The code signal generation circuit 21 may generate the first to fourth code signals CODE<1:4> which are sequentially enabled by the read signal RD and the feedback signal LAT_FED. The code signal generation circuit 21 may generate the first to fourth code signals CODE<1:4> which are sequentially enabled by the read signal RD while the feedback signal LAT_FED is disabled. The code signal generation circuit 21 may generate the first code signal CODE<1> which is enabled when the read signal RD is inputted to the code signal generation circuit 21 once while the feedback signal LAT_FED is disabled. The code signal generation circuit 21 may generate the second code signal CODE<2> which is enabled when the read signal RD is inputted to the code signal generation circuit 21 twice while the feedback signal LAT_FED is disabled. The code signal generation circuit 21 may generate the third code signal CODE<3> which is enabled when the read signal RD is inputted to the code signal generation circuit 21 three times while the feedback signal LAT_FED is disabled. The code signal generation circuit 21 may generate the fourth code signal CODE<4> which is enabled when the read signal RD is inputted to the code signal generation circuit 21 four times while the feedback signal LAT_FED is disabled. Although FIG. 9 illustrates an example in which the first to fourth code signals CODE<1:4> are generated, the number of bits included in the code signal may be set to be different according to the embodiments.

The delay time control circuit 22 may delay the read signal RD by a delay time, which is adjusted by the first to fourth code signals CODE<1:4>, to generate the latch control signal LAT_CON. The delay time control circuit 22 may delay the read signal RD by a first delay time to generate the latch control signal LAT_CON when the first code signal CODE<1> is enabled. The delay time control circuit 22 may delay the read signal RD by a second delay time to generate the latch control signal LAT_CON when the second code signal CODE<2> is enabled. The delay time control circuit 22 may delay the read signal RD by a third delay time to generate the latch control signal LAT_CON when the third code signal CODE<3> is enabled. The delay time control circuit 22 may delay the read signal RD by a fourth delay time to generate the latch control signal LAT_CON when the fourth code signal CODE<4> is enabled. The fourth delay time may be set to be longer than the third delay time. The third delay time may be set to be longer than the second delay time. The second delay time may be set to be longer than the first delay time.

Figure 10:
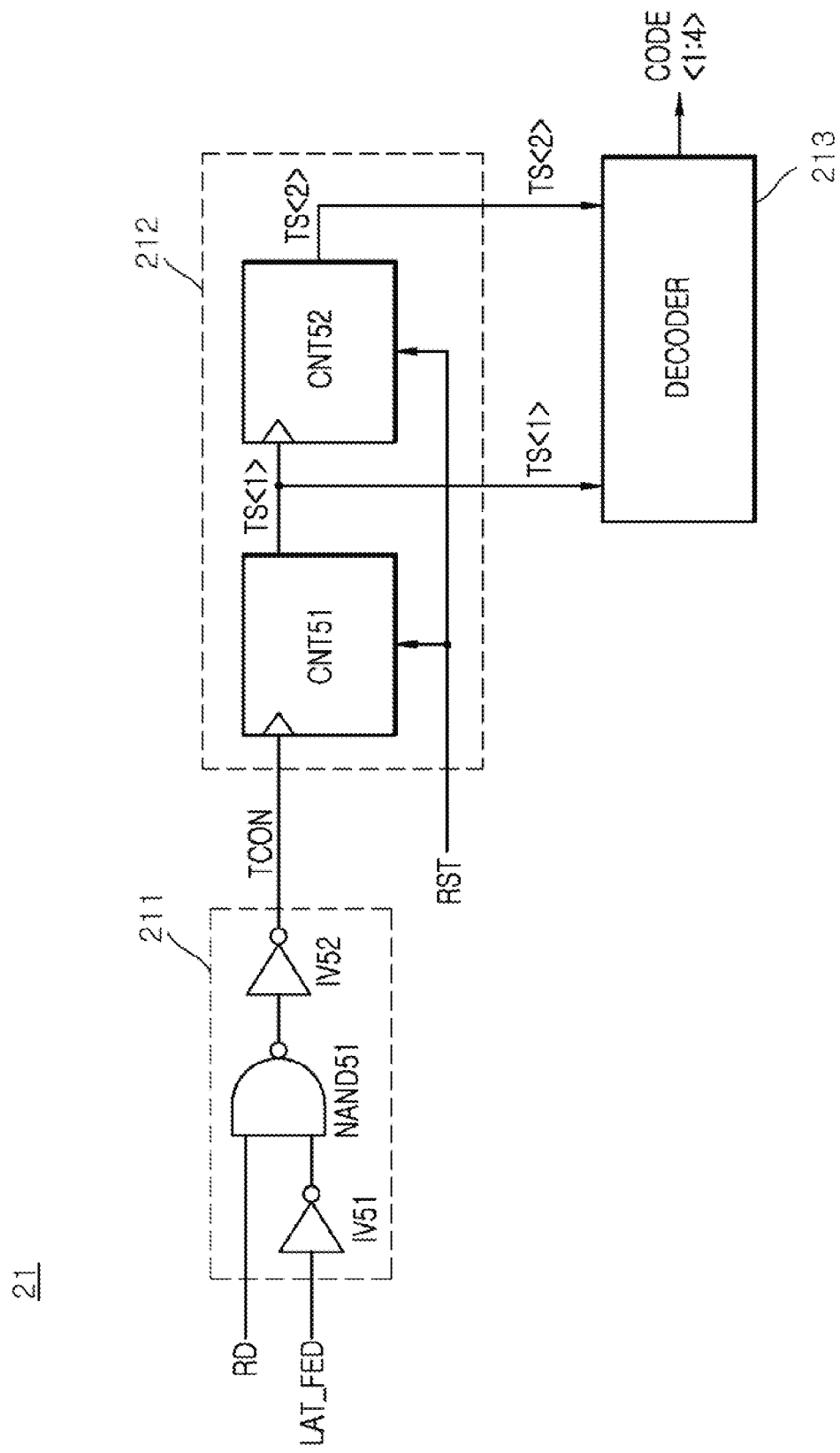
FIG. 10 illustrates a configuration of a code signal generation circuit included in the variable delay circuit of FIG. 9.

Referring to FIG. 10, the code signal generation circuit 21 may include a transfer control signal generation circuit 211, a transfer signal generation circuit 212, and a decoder 213.

The transfer control signal generation circuit 211 may be realized using inverters IV51 and IV52 and a NAND gate NAND51. The transfer control signal generation circuit 211 may generate a transfer control signal TCON which is enabled by the read signal RD while the feedback signal LAT_FED is disabled. The transfer control signal generation circuit 211 may buffer the read signal RD to generate the transfer control signal TCON while the feedback signal LAT_FED is disabled to have a logic "low" level.

The transfer signal generation circuit 212 may be realized using a first counter CNT51 and a second counter CNT52 which are coupled in series. The transfer signal generation circuit 212 may generate first and second transfer signals TS<1:2> which are initialized by the reset signal RST. The transfer signal generation circuit 212 may generate the first and second transfer signals TS<1:2> that are sequentially counted according to the transfer control signal TCON. The transfer signal generation circuit 212 may generate the first transfer signal TS<1> having a logic "low" level and the second transfer signal TS<2> having a logic "low" level when the reset signal RST is inputted to the transfer signal generation circuit 212. The transfer signal generation circuit 212 may generate the first transfer signal TS<1> having a logic "high" level and the second transfer signal TS<2> having a logic "low" level when the transfer control signal TCON is inputted to the transfer signal generation circuit 212 once. The transfer signal generation circuit 212 may generate the first transfer signal TS<1> having a logic "low" level and the second transfer signal TS<2> having a logic "high" level when the transfer control signal TCON is inputted to the transfer signal generation circuit 212 twice. The transfer signal generation circuit 212 may generate the first transfer signal TS<1> having a logic "high" level and the second transfer signal TS<2> having a logic "high" level when the transfer control signal TCON is inputted to the transfer signal generation circuit 212 three times. The reset signal RST may be set as a signal which is enabled to have a logic "high" level to perform the initialization operation of the semiconductor device 1.

The decoder 213 may decode the first and second transfer signals TS<1:2> to generate the first to fourth code signals CODE<1:4> which are sequentially enabled. The decoder 213 may generate the first code signal CODE<1> which is enabled to have a logic "high" level when the first transfer signal TS<1> has a logic "low" level and the second transfer signal TS<2> has a logic "low" level. The decoder 213 may generate the second code signal CODE<2> which is enabled to have a logic "high" level when the first transfer signal TS<1> has a logic "high" level and the second transfer signal TS<2> has a logic "low" level. The decoder 213 may generate the third code signal CODE<3> which is enabled to have a logic "high" level when the first transfer signal TS<1> has a logic "low" level and the second transfer signal TS<2> has a logic "high" level. The decoder 213 may generate the fourth code signal CODE<4> which is enabled to have a logic "high" level when the first transfer signal TS<1> has a logic "high" level and the second transfer signal TS<2> has a logic "high" level.

Figure 11:
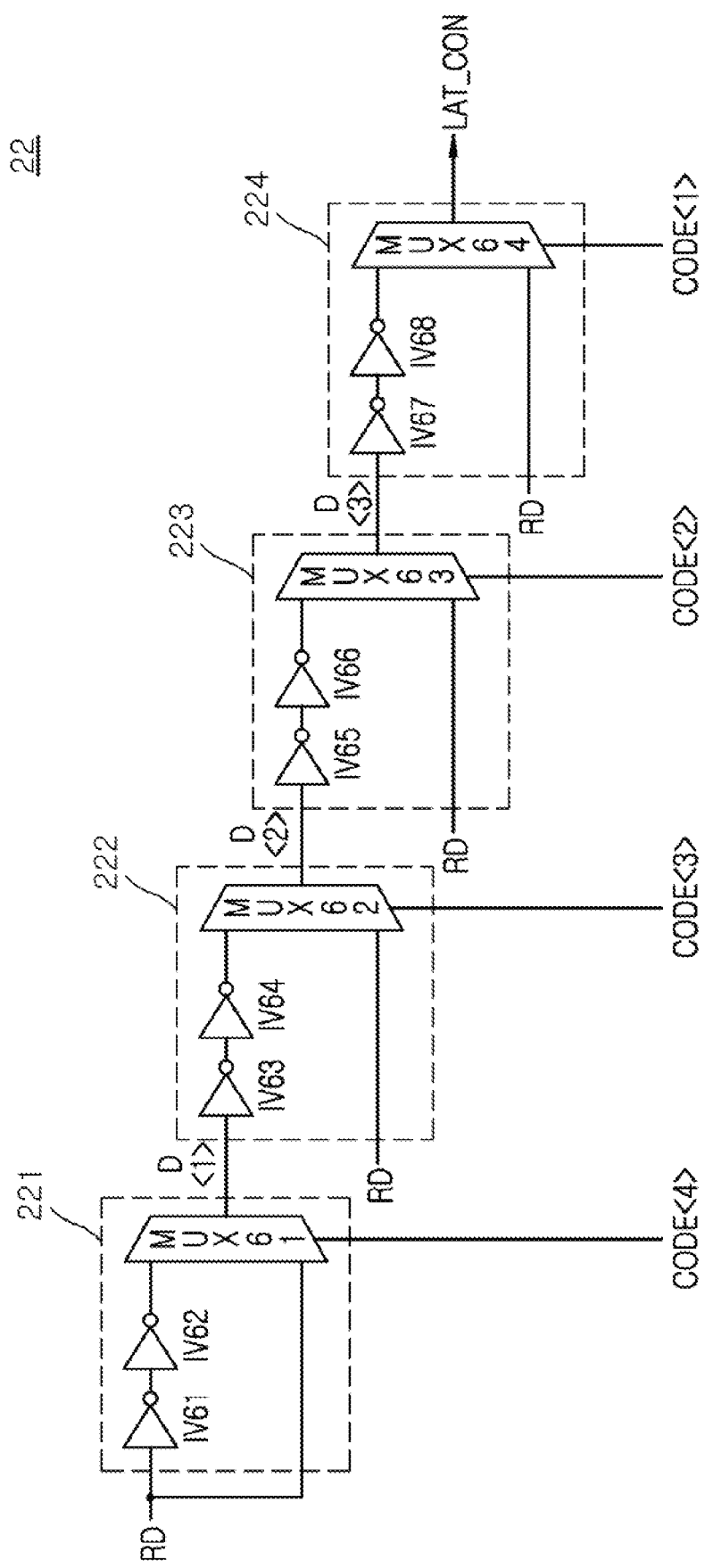
FIG. 11 illustrates a configuration of a delay time control circuit included in the variable delay circuit of FIG. 9.

Referring to FIG. 11, the delay time control circuit 22 may include a first delay circuit 221, a second delay circuit 222, a third delay circuit 223, and a fourth delay circuit 224.

The first delay circuit 221 may be realized using inverters IV61 and IV62 and a multiplexer MUX61. The first delay circuit 221 may delay the read signal RD by a delay time set by the inverters IV61 and IV62 to generate a first delayed signal D<1> when the fourth code signal CODE<4> is enabled to have a logic "high" level. The first delay circuit 221 may output the read signal RD as the first delayed signal D<1> when the fourth code signal CODE<4> is disabled to have a logic "low" level.

The second delay circuit 222 may be realized using inverters IV63 and IV64 and a multiplexer MUX62. The second delay circuit 222 may delay the first delayed signal D<1> by a delay time set by the inverters IV63 and IV64 to generate a second delayed signal D<2> when the third code signal CODE<3> is enabled to have a logic "high" level. The second delay circuit 222 may output the read signal RD as the second delayed signal D<2> when the third code signal CODE<3> is disabled to have a logic "low" level.

The third delay circuit 223 may be realized using inverters IV65 and IV66 and a multiplexer MUX63. The third delay circuit 223 may delay the second delayed signal D<2> by a delay time set by the inverters IV65 and IV66 to generate a third delayed signal D<3> when the second code signal CODE<2> is enabled to have a logic "high" level. The third delay circuit 223 may output the read signal RD as the third delayed signal D<3> when the second code signal CODE<2> is disabled to have a logic "low" level.

The fourth delay circuit 224 may be realized using inverters IV67 and IV68 and a multiplexer MUX64. The fourth delay circuit 224 may delay the third delayed signal D<3> by a delay time set by the inverters IV67 and IV68 to generate the latch control signal LAT_CON when the first code signal CODE<1> is enabled to have a logic "high" level. The fourth delay circuit 224 may output the read signal RD as the latch control signal LAT_CON when the first code signal CODE<1> is disabled to have a logic "low" level.

Figure 12:
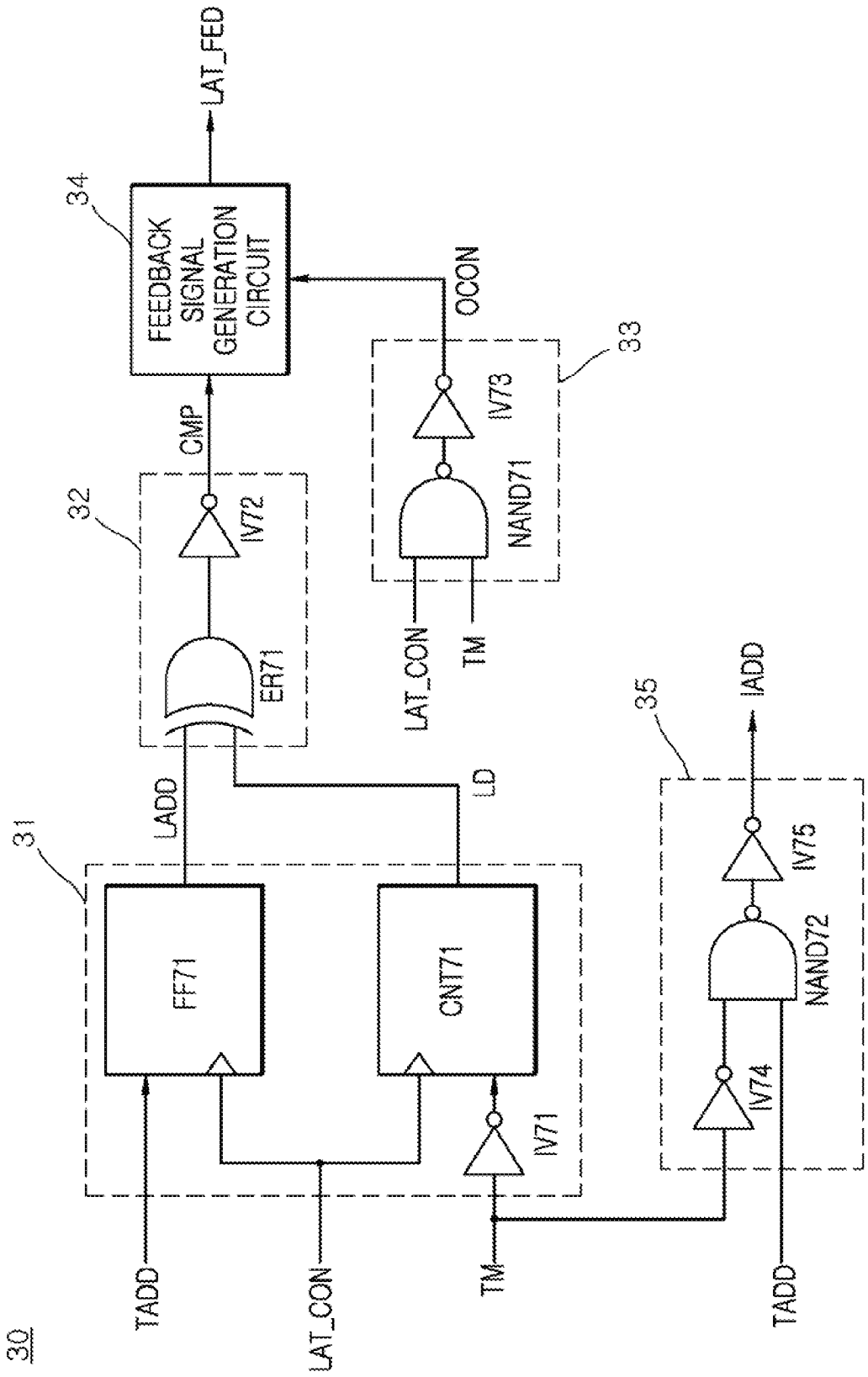
FIG. 12 illustrates a configuration of an address latch circuit included in the semiconductor device of FIG. 1.

Referring to FIG. 12, the address latch circuit 30 may include a latch circuit 31, a comparison circuit 32, an output control signal generation circuit 33, a feedback signal generation circuit 34, and an internal address generation circuit 35.

The latch circuit 31 may be realized using an inverter IV71, a flip-flop FF71, and a counter CNT71. The latch circuit 31 may latch the transfer address TADD when the latch control signal LAT_CON having a logic "high" level is inputted to the latch circuit 31, thereby generating a latched address LADD. The latch circuit 31 may generate a latched delay signal LD which is initialized to have a logic "low" level when the test mode signal TM having a logic "high" level is inputted to the latch circuit 31. The latch circuit 31 may generate the latched delay signal LD which is enabled to have a logic "high" level when the latch control signal LAT_CON having a logic "high" level is inputted to the latch circuit 31.

The comparison circuit 32 may be realized using an exclusive OR gate ER71 and an inverter IV72. The comparison circuit 32 may compare the latched address LADD with the latched delay signal LD to generate a comparison signal CMP. The comparison circuit 32 may generate the comparison signal CMP which is enabled to have a logic "high" level when the latched address LADD and the latched delay signal LD have the same logic level. The comparison circuit 32 may generate the comparison signal CMP which is disabled to have a logic "low" level when the latched address LADD and the latched delay signal LD have different logic levels.

The output control signal generation circuit 33 may be realized using a NAND gate NAND71 and an inverter IV73. The output control signal generation circuit 33 may buffer the latch control signal LAT_CON to generate an output control signal OCON while the test mode signal TM is enabled to have a logic "high" level. The output control signal generation circuit 33 may generate the output control signal OCON which is enabled to have a logic "high" level when the latch control signal LAT_CON is enabled to have a logic "high" level while the test mode signal TM is enabled to have a logic "high" level. The output control signal generation circuit 33 may perform a logical AND operation of the latch control signal LAT_CON and the test mode signal TM to generate the output control signal OCON.

The feedback signal generation circuit 34 may be synchronized with the output control signal OCON to output the comparison signal CMP as the feedback signal LAT_FED. The feedback signal generation circuit 34 may output the comparison signal CMP as the feedback signal LAT_FED while the output control signal OCON is enabled to have a logic "high" level.

The internal address generation circuit 35 may be realized using inverters IV74 and IV75 and a NAND gate NAND72. The internal address generation circuit 35 may buffer the transfer address TADD to generate the internal address IADD when the test mode signal TM is disabled to have a logic "low" level.

The initialization operation of the semiconductor device 1 is described hereinafter with reference to FIG. 13 when the semiconductor device 1 performs a fast operation.

Figure 13:
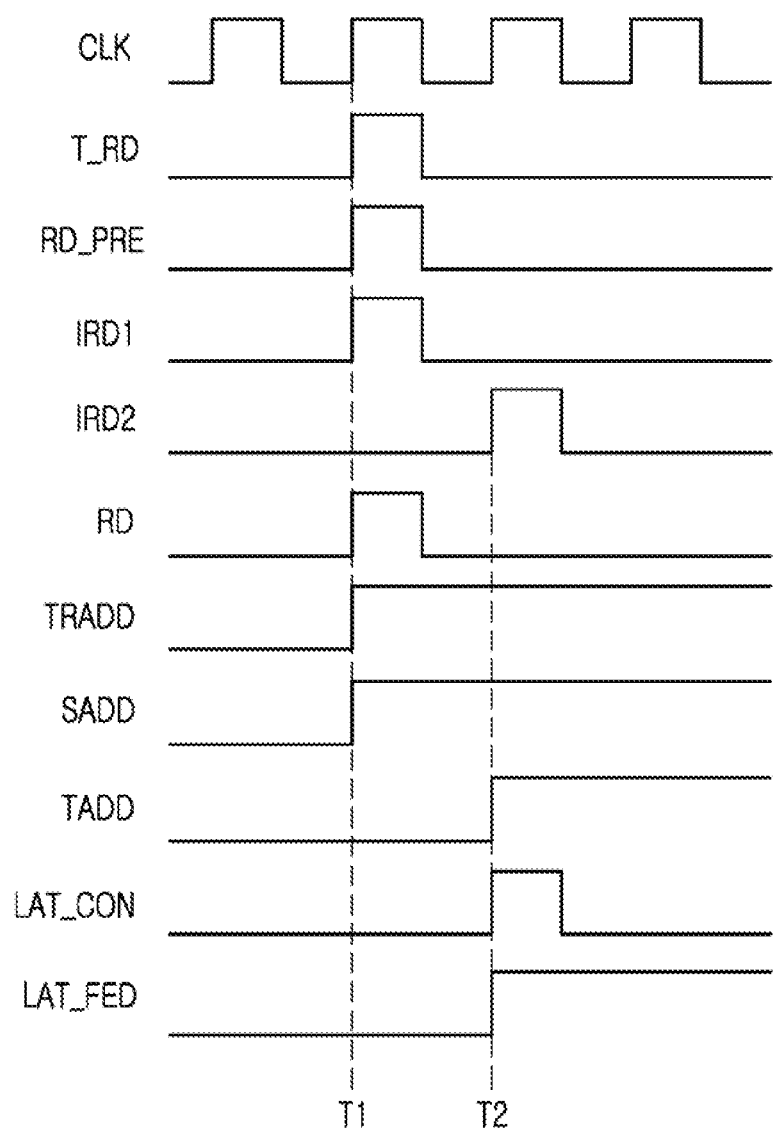
FIGS. 13 and 14 are timing diagrams illustrating an initialization operation of a semiconductor device according to an embodiment of the present disclosure.

Referring to FIG. 13, at time "T1", the test read signal generation circuit 12 may generate the test read signal T_RD which is enabled to have a logic "high" level by the clock signal CLK.

The pre-read signal generation circuit 110 may generate the pre-read signal RD_PRE which is enabled to have a logic "high" level by the test read signal T_RD having a logic "high" level.

The read signal generation circuit 120 may delay the pre-read signal RD_PRE in synchronization with the clock signal CLK to generate the first internal read signal IRD1 and may generate the read signal RD from the first internal read signal IRD1 based on the operation frequency set signal MR_SP.

The transfer read address generation circuit 131 of the transfer address generation circuit 130 may generate the transfer read address TRADD from the test mode signal TM and the first internal read signal IRD1.

The selection address generation circuit 132 may generate the selection address SADD from the transfer read address TRADD based on the test mode signal TM. In such a case, the code signal generation circuit 21 may generate the first to fourth code signals CODE<1:4> which are sequentially enabled by the read signal RD having a logic "high" level and the feedback signal LAT_FED having a logic "low" level.

At time "T2", the read signal generation circuit 120 may delay the first internal read signal IRD1 in synchronization with the clock signal CLK to generate the second internal read signal IRD2.

The address output circuit 133 may output the selection address SADD as the transfer address TADD based on the second internal read signal IRD2.

The delay time control circuit 22 may delay the read signal RD generated at time "T1" by a delay time, which is adjusted by the first to fourth code signals CODE<1:4>, to generate the latch control signal LAT_CON having a logic "high" level.

The address latch circuit 30 may detect a logic level of the transfer address TADD based on the latch control signal LAT_CON to generate the feedback signal LAT_FED having a logic "high" level.

The code signal generation circuit 21 may fix the first to fourth code signals CODE<1:4> based on the feedback signal LAT_FED having a logic "high" level.

As described above, a semiconductor device according to an embodiment may select a first internal read signal during an initialization operation in a fast operation mode and may adjust a delay time for delaying a read signal according to a comparison result between the first internal read signal and an address to prevent the mismatching between the address and the read signal for latching the address.

The initialization operation of the semiconductor device 1 is described hereinafter with reference to FIG. 14 when the semiconductor device 1 performs a slow operation.

Figure 14:
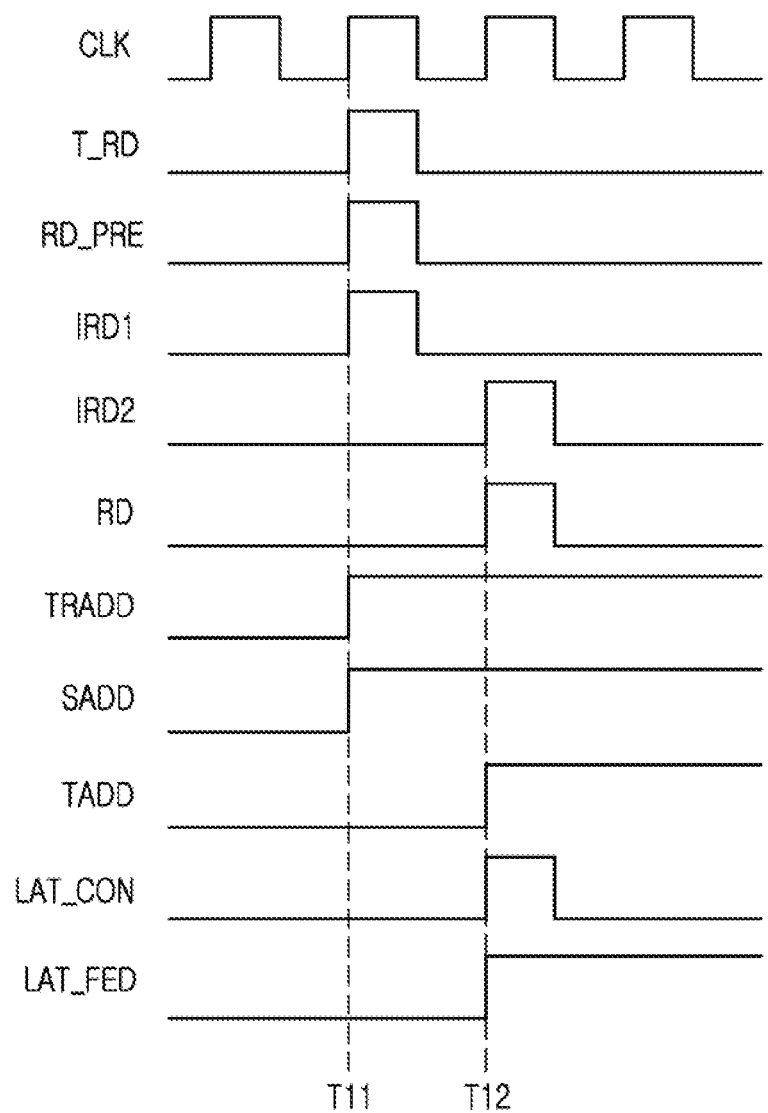

Referring to FIG. 14, at time "T11", the test read signal generation circuit 12 may generate the test read signal T_RD which is enabled to have a logic "high" level by the clock signal CLK.

The pre-read signal generation circuit 110 may generate the pre-read signal RD_PRE which is enabled to have a logic "high" level by the test read signal T_RD having a logic "high" level.

The read signal generation circuit 120 may delay the pre-read signal RD_PRE in synchronization with the clock signal CLK to generate the first internal read signal IRD1.

The transfer read address generation circuit 131 of the transfer address generation circuit 130 may generate the transfer read address TRADD from the test mode signal TM and the first internal read signal IRD1.

The selection address generation circuit 132 may generate the selection address SADD from the transfer read address TRADD based on the test mode signal TM. In such a case, the code signal generation circuit 21 may fix the first to fourth code signals CODE<1:4> based on the read signal RD having a logic "low" level and the feedback signal LAT_FED having a logic "low" level.

At time "T12", the read signal generation circuit 120 may delay the first internal read signal IRD1 generated at time "T11" in synchronization with the clock signal CLK to generate the second internal read signal IRD2 and may generate the read signal RD from the second internal read signal IRD2 based on the operation frequency set signal MR_SP.

The address output circuit 133 may output the selection address SADD as the transfer address TADD based on the second internal read signal IRD2.

The delay time control circuit 22 may generate the latch control signal LAT_CON having a logic "high" level from the read signal RD based on the fixed first to fourth code signals CODE<1:4>

The address latch circuit 30 may detect a logic level of the transfer address TADD based on the latch control signal LAT_CON to generate the feedback signal LAT_FED having a logic "high" level.

The code signal generation circuit 21 may fix the first to fourth code signals CODE<1:4> based on the feedback signal LAT_FED having a logic "high" level.

As described above, a semiconductor device according to an embodiment may select a second internal read signal during an initialization operation in a slow operation mode and may adjust a delay time for delaying a read signal according to a comparison result between the second internal read signal and an address to prevent the mismatching between the address and the read signal for latching the address.

According to the embodiment described above, any one of internal read signals for latching an address may be selected according to an operation speed during an initialization operation, and an input time of the selected internal read signal may be compared with an input time of the address to adjust a delay time for delaying a read signal according to the comparison result. Accordingly, it may be possible to prevent the mismatching between the address and the read signal for latching the address.

Figure 15:
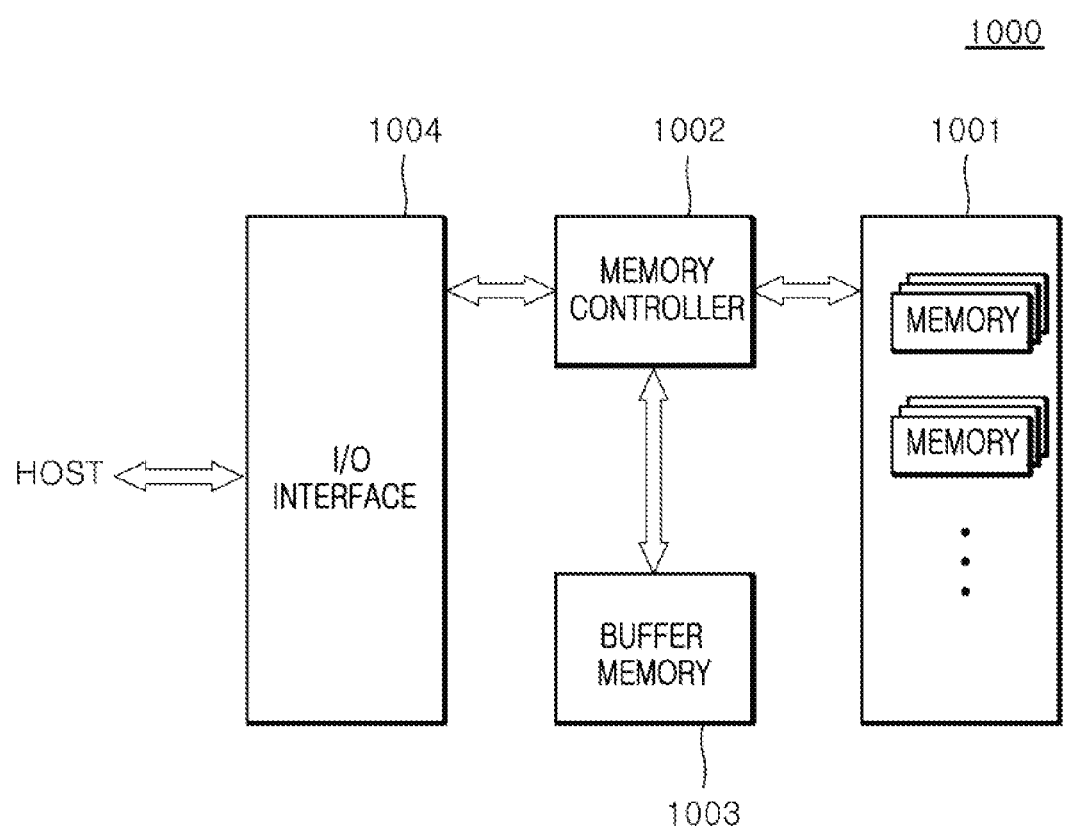
FIG. 15 is a block diagram illustrating a configuration of an electronic system employing the semiconductor device described with reference to FIGS. 1 to 14.

The semiconductor device described with reference to FIGS. 1 to 14 may be applied to an electronic system that includes a memory system, a graphic system, a computing system, a mobile system, or the like. For example, as illustrated in FIG. 15, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 1 illustrated in FIG. 1. Meanwhile, the data storage circuit 1001 may include nonvolatile memory that can retain its stored data even when its power supply is interrupted. The nonvolatile memory may be flash memory such as NOR-type flash memory or NAND-type flash memory, phase change random access memory (PRAM), resistive random access memory (RRAM), spin transfer torque random access memory (STTRAM), magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 15 illustrates the memory controller 1002 with a single block, the memory controller 1002 may include one controller for controlling the data storage circuit 1001 comprised of nonvolatile memory and another controller for controlling the buffer memory 1003 comprised of volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include volatile memory such as dynamic random access memory (DRAM), mobile DRAM, or static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004.

The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a variable delay circuit configured to delay a read signal by a delay time to generate a latch control signal during an initialization operation and configured to receive a feedback signal to adjust the delay time for delaying the read signal during the initialization operation; and
   an address latch circuit configured to detect a logic level of a transfer address when the latch control signal is inputted to the address latch circuit and configured to generate the feedback signal.

2. The semiconductor device of claim 1, wherein the variable delay circuit is configured to gradually increase the delay time for delaying the read signal during the initialization operation.

3. The semiconductor device of claim 1, wherein the feedback signal is enabled when the transfer address has a predetermined logic level when the latch control signal is inputted to the address latch circuit.

4. The semiconductor device of claim 1, wherein the variable delay circuit comprises:
   a code signal generation circuit configured to generate first to fourth code signals which are initialized by a reset signal and are sequentially enabled by the read signal and the feedback signal; and
   a delay time control circuit configured to delay the read signal by the delay time to generate the latch control signal, wherein the delay time is adjusted according to the first to fourth code signals.

5. The semiconductor device of claim 4, wherein the code signal generation circuit comprises:
- a transfer control signal generation circuit configured to generate a transfer control signal which is enabled by the read signal while the feedback signal is disabled;
- a transfer signal generation circuit configured to generate a first transfer signal and a second transfer signal which are initialized by the reset signal and the transfer signal generation circuit configured to generate the first transfer signal and the second transfer signal which are sequentially counted according to the transfer control signal; and
- a decoder configured to decode the first and second transfer signals to generate the first to fourth code signals which are sequentially enabled.

6. The semiconductor device of claim 4, wherein the delay time control circuit comprises:
- a first delay circuit configured to delay the read signal to generate a first delayed signal or to output the read signal as the first delayed signal, according to a logic level of the fourth code signal;
- a second delay circuit configured to delay the first delayed signal to generate a second delayed signal or to output the read signal as the second delayed signal, according to a logic level of the third code signal;
- a third delay circuit configured to delay the second delayed signal to generate a third delayed signal or to output the read signal as the third delayed signal, according to a logic level of the second code signal; and
- a fourth delay circuit configured to delay the third delayed signal to generate the latch control signal or to output the read signal as the latch control signal, according to a logic level of the first code signal.

7. The semiconductor device of claim 1, wherein the address latch circuit comprises:
- a latch circuit configured to generate a latched address by latching the transfer address when the latch control signal is inputted to the latch circuit and configured to generate a latched delay signal which is disabled by a test mode signal and is enabled by the latch control signal;
- a comparison circuit configured to compare the latched address with the latched delay signal to generate a comparison signal;
- an output control signal generation circuit configured to generate an output control signal which is enabled by the latch control signal while the test mode signal is enabled; and
- a feedback signal generation circuit configured to be synchronized with the output control signal to output the comparison signal as the feedback signal.

8. A semiconductor device comprising:
- a training control circuit configured to generate a read signal from a first internal read signal and a second internal read signal and configured to generate a transfer address from a test mode signal and the first and second internal read signals during an initialization operation;
- a variable delay circuit configured to delay the read signal to generate a latch control signal and configured to receive a feedback signal to adjust a delay time for delaying the read signal; and
- an address latch circuit configured to detect a logic level of the transfer address when the latch control signal is inputted to the address latch circuit and configured to generate the feedback signal.

9. The semiconductor device of claim 8, wherein the first internal read signal and the second internal read signal are sequentially generated in synchronization with a clock signal.

10. The semiconductor device of claim 8, wherein the read signal is generated from one of the first internal read signal and the second internal read signal according to an operation speed of the semiconductor device.

11. The semiconductor device of claim 8, wherein the variable delay circuit is configured to gradually increase the delay time for delaying the read signal during the initialization operation.

12. The semiconductor device of claim 8, wherein the feedback signal is enabled when the transfer address has a predetermined logic level when the latch control signal is inputted to the address latch circuit.

13. The semiconductor device of claim 8, wherein the training control circuit comprises:
- a test read signal generation circuit configured to generate a test read signal which is initialized by the test mode signal and is enabled by a clock signal; and
- a control circuit configured to output one of the first internal read signal and the second internal read signal, which are generated when the test mode signal is enabled based on an operation frequency set signal, as the read signal and configured to generate the transfer address from the test mode signal.

14. The semiconductor device of claim 13, wherein the control circuit comprises:
- a pre-read signal generation circuit configured to generate a pre-read signal which is enabled when the test read signal is enabled;
- a read signal generation circuit configured to repeatedly delay the pre-read signal in synchronization with the clock signal to sequentially generate the first internal read signal and the second internal read signal and configured to be synchronized with the clock signal to output one of the first internal read signal and the second internal read signal as the read signal based on the operation frequency set signal; and
- a transfer address generation circuit configured to generate the transfer address from the test mode signal and the first and second internal read signals.

15. The semiconductor device of claim 14, wherein the read signal generation circuit comprises:
- an internal read signal generation circuit configured to delay the pre-read signal in synchronization with the clock signal to generate the first internal read signal and configured to delay the first internal read signal in synchronization with the clock signal to generate the second internal read signal;
- a transfer read signal generation circuit configured to buffer the first internal read signal in synchronization with the clock signal to generate a first transfer read signal and configured to buffer the second internal read signal in synchronization with the clock signal to generate a second transfer read signal;
- a selection/transfer circuit configured to output one of the first transfer read signal and the second transfer read signal as a selection read signal based on the operation frequency set signal; and
- a pulse width control circuit configured to generate the read signal including a pulse which is created when the selection read signal is inputted to the pulse width control circuit.

16. The semiconductor device of claim 14, wherein the transfer address generation circuit comprises:

a transfer read address generation circuit configured to generate a transfer read address which is initialized by the test mode signal and is enabled when the first internal read signal is inputted to the transfer read address generation circuit;

a selection address generation circuit configured to generate a selection address from the transfer read address when the test mode signal is enabled; and an address output circuit configured to output the selection address as the transfer address when the second internal read signal is inputted to the address output circuit.

17. The semiconductor device of claim 8, wherein the variable delay circuit comprises:

a code signal generation circuit configured to generate first to fourth code signals which are initialized by a reset signal and are sequentially enabled by the read signal and the feedback signal; and a delay time control circuit configured to delay the read signal by a delay time to generate the latch control signal, wherein the delay time is adjusted according to the first to fourth code signals.

18. The semiconductor device of claim 17, wherein the code signal generation circuit comprises:

a transfer control signal generation circuit configured to generate a transfer control signal which is enabled by the read signal while the feedback signal is disabled;

a transfer signal generation circuit configured to generate a first transfer signal and a second transfer signal which are initialized by the reset signal and the transfer signal generation circuit configured to generate the first transfer signal and the second transfer signal which are sequentially counted according to the transfer control signal; and a decoder configured to decode the first and second transfer signals to generate the first to fourth code signals which are sequentially enabled.

19. The semiconductor device of claim 17, wherein the delay time control circuit comprises:

a first delay circuit configured to delay the read signal to generate a first delayed signal or to output the read signal as the first delayed signal, according to a logic level of the fourth code signal;

a second delay circuit configured to delay the first delayed signal to generate a second delayed signal or to output the read signal as the second delayed signal, according to a logic level of the third code signal;

a third delay circuit configured to delay the second delayed signal to generate a third delayed signal or to output the read signal as the third delayed signal, according to a logic level of the second code signal; and a fourth delay circuit configured to delay the third delayed signal to generate the latch control signal or to output the read signal as the latch control signal, according to a logic level of the first code signal.

20. The semiconductor device of claim 8, wherein the address latch circuit comprises:

a latch circuit configured to generate a latched address by latching the transfer address when the latch control signal is inputted to the latch circuit and configured to generate a latched delay signal which is disabled by the test mode signal and is enabled by the latch control signal;

a comparison circuit configured to compare the latched address with the latched delay signal to generate a comparison signal;

an output control signal generation circuit configured to generate an output control signal which is enabled by the latch control signal while the test mode signal is enabled; and a feedback signal generation circuit configured to be synchronized with the output control signal to output the comparison signal as the feedback signal.

21. The semiconductor device of claim 20, wherein the address latch circuit further comprises:

an internal address generation circuit is configured to buffer the transfer address to generate an internal address when the test mode signal is disabled.

22. The semiconductor device of claim 8, wherein the training control circuit is configured to:

generate the read signal when a chip selection signal and a command/address signal have a predetermined logic level combination in a normal mode after the initialization operation; and generate the transfer address from an external address in the normal mode.

23. The semiconductor device of claim 22, wherein the address latch circuit is synchronized with the latch control signal to generate an internal address from the transfer address in the normal mode.

24. The semiconductor device of claim 22, further comprising a memory circuit configured to receive or output data based on an internal address generated from the transfer address in the normal mode.

* * * * *